United States Patent
Sabde et al.

(10) Patent No.: US 6,595,833 B2
(45) Date of Patent: *Jul. 22, 2003

(54) METHOD AND APPARATUS FOR MECHANICAL AND CHEMICAL-MECHANICAL PLANARIZATION OF MICROELECTRONIC SUBSTRATES WITH METAL COMPOUND ABRASIVES

(75) Inventors: Gundu M. Sabde, Boise, ID (US); Scott Meikle, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/874,536

(22) Filed: Jun. 4, 2001

(65) Prior Publication Data

US 2001/0024928 A1 Sep. 27, 2001

Related U.S. Application Data

(60) Continuation of application No. 09/692,888, filed on Oct. 19, 2000, which is a division of application No. 09/387,067, filed on Aug. 31, 1999.

(51) Int. Cl.⁷ ............................................... B24B 1/00
(52) U.S. Cl. .................... 451/41; 451/526; 451/533
(58) Field of Search .................. 451/41, 285, 287–290, 451/388, 526–539; 51/297

(56) References Cited

U.S. PATENT DOCUMENTS

| | | | |
|---|---|---|---|
| 5,209,816 A | 5/1993 | Yu et al. | 156/636 |
| 5,234,867 A | 8/1993 | Schultz et al. | 437/225 |
| 5,658,190 A | 8/1997 | Wright et al. | 451/285 |
| 5,664,989 A | 9/1997 | Nakata et al. | 451/41 |
| 5,676,587 A | 10/1997 | Landers et al. | 451/57 |
| 5,692,950 A | 12/1997 | Rutherford et al. | 451/552 |
| 5,733,178 A * | 3/1998 | Ohishi | 451/41 |
| 5,810,964 A | 9/1998 | Shiraishi | 156/345 |
| 5,913,716 A | 6/1999 | Mucci et al. | 451/59 |
| 5,972,124 A * | 10/1999 | Sethuraman et al. | 134/7 |
| 5,997,384 A | 12/1999 | Blalock | 451/41 |
| 6,007,407 A | 12/1999 | Rutherford et al. | 451/41 |
| 6,039,633 A * | 3/2000 | Chopra | 451/41 |
| 6,176,763 B1 * | 1/2001 | Kramer et al. | 451/41 |
| 6,180,020 B1 * | 1/2001 | Moriyama et al. | 216/88 |

* cited by examiner

Primary Examiner—Joseph J. Hail, III
Assistant Examiner—Anthony Ojini
(74) Attorney, Agent, or Firm—Dorsey & Whitney LLP

(57) ABSTRACT

A method and apparatus for planarizing a microelectronic substrate. In one embodiment, the apparatus can include a fixed abrasive polishing pad having metal abrasive elements selected to be a compound of metal in the substrate. Alternatively, the metal abrasive elements can include a refractory metal where the substrate includes a refractory metal. Where the substrate includes two metals, the abrasive elements can be selected to planarize the first metal at a rate that is less than approximately twice the rate at which it planarizes the second metal. A single fixed abrasive polishing pad and a single planarizing liquid can be used to planarize both metals.

44 Claims, 4 Drawing Sheets

METHOD AND APPARATUS FOR MECHANICAL AND CHEMICAL-MECHANICAL PLANARIZATION OF MICROELECTRONIC SUBSTRATES WITH METAL COMPOUND ABRASIVES

CROSS-REFERENCE TO RELATED APPLICATION

This application is a continuation of pending U.S. patent application Ser. No. 09/692,888, filed Oct. 19, 2000, which is a divisional of U.S. patent application Ser. No. 09/387,067, filed Aug. 31, 1999.

TECHNICAL FIELD

The present invention relates to pads having metal and/or metal compound abrasives for planarizing microelectronic substrates in mechanical and chemical-mechanical planarizing processes.

BACKGROUND OF THE INVENTION

Mechanical and chemical-mechanical planarizing processes (collectively "CMP") are used in the manufacturing of microelectronic devices for forming a flat surface on semiconductor wafers, field emission displays and many other microelectronic-device substrates and substrate assemblies. FIG. 1 schematically illustrates a CMP machine 10 having a platen 20. The platen 20 supports a planarizing medium 40 that can include a polishing pad 41 having a planarizing surface 42 on which a planarizing liquid 43 is disposed. The polishing pad 41 may be a conventional polishing pad made from a continuous phase matrix material (e.g., polyurethane), or it may be a new generation fixed-abrasive polishing pad made from abrasive particles fixedly dispersed in a suspension medium. The planarizing liquid 43 may be a conventional CMP slurry with abrasive particles and chemicals that remove material from the wafer, or the planarizing liquid may be a planarizing solution without abrasive particles. In most CMP applications, conventional CMP slurries are used on conventional polishing pads, and planarizing solutions without abrasive particles are used on fixed abrasive polishing pads.

The CMP machine 10 can also include an underpad 25 attached to an upper surface 22 of the platen 20 and the lower surface of the polishing pad 41. A drive assembly 26 rotates the platen 20 (as indicated by arrow A), and/or it reciprocates the platen 20 back and forth (as indicated by arrow B). Because the polishing pad 41 is attached to the underpad 25, the polishing pad 41 moves with the platen 20.

A wafer carrier 30 is positioned adjacent the polishing pad 41 and has a lower surface 32 to which a substrate assembly 12 may be attached via suction. Alternatively, the substrate assembly 12 may be attached to a resilient pad 34 positioned between the substrate assembly 12 and the lower surface 32. The wafer carrier 30 may be a weighted, free-floating wafer carrier, or an actuator assembly 33 may be attached to the wafer carrier to impart axial and/or rotational motion (as indicated by arrows C and D, respectively).

To planarize the substrate assembly 12 with the CMP machine 10, the wafer carrier 30 presses the substrate assembly 12 face-downward against the polishing pad 41. While the face of the substrate assembly 12 presses against the polishing pad 41, at least one of the platen 20 or the wafer carrier 30 moves relative to the other to move the substrate assembly 12 across the planarizing surface 42. As the face of the substrate assembly 12 moves across the planarizing surface 42, material is continuously removed from the face of the substrate assembly 12.

CMP processes should consistently and accurately produce a uniformly planar surface on the substrate assembly to enable precise fabrication of circuits and photo-patterns. During the fabrication of transistors, contacts, interconnects and other features, many substrates develop large "step heights" that create a highly topographic surface across the substrate. Yet, as the density of integrated circuits increases, it is necessary to have a planar substrate surface at several stages of processing the substrate because non-uniform substrate surfaces significantly increase the difficulty of forming sub-micron features. For example, it is difficult to accurately focus photo-patterns to within tolerances approaching 0.1 $\mu$m on non-uniform substrate surfaces because sub-micron photolithographic equipment generally has a very limited depth of field. Thus, CMP processes are often used to transform a topographical substrate surface into a highly uniform, planar substrate surface.

In the competitive semiconductor industry, it is also highly desirable to have a high yield in CMP processes by producing a uniformly planar surface at a desired endpoint on a substrate assembly as quickly as possible. For example, when a conductive layer on a substrate assembly is under-planarized in the formation of contacts or interconnects, many of these components may not be electrically isolated from one another because undesirable portions of the conductive layer may remain on the substrate over a dielectric layer. Additionally, when a substrate is over-planarized, components below the desired endpoint may be damaged or completely destroyed. Thus, to provide a high yield of operable microelectronic devices, CMP processing should quickly remove material until the desired endpoint is reached.

The planarity of the finished substrate assemblies and the yield of CMP processing is a function of several factors, one of which is the rate at which material is removed from the substrate assembly (the "polishing rate"). Although it is desirable to have a high polishing rate to reduce the duration of each planarizing cycle, the polishing rate should be uniform across the substrate to produce a uniformly planar surface. The polishing rate should also be consistent to accurately endpoint CMP processing at a desired elevation in the substrate assembly. The polishing rate, therefore, should be controlled to provide accurate, reproducible results.

In manufacturing microelectronic substrate assemblies, metal features are typically incorporated into the substrate to electrically connect devices and features of the substrate. For example, metal plugs can extend between layers of the substrate assembly to connect portions of the layers, and metal interconnects can extend from one region of a layer to another to connect features on the same layer. The metal features can include a conductive element surrounded by a diffusion barrier, each formed from a different metal composition. During planarization, the material forming the conductive element typically planarizes at a faster rate than does the material forming the diffusion barrier. Accordingly, the conductive element can become "dished" relative to the surrounding diffusion barrier, resulting in an uneven surface topography. As discussed above, an uneven surface typography can make it difficult to form sub-micron devices.

One approach to addressing this problem has been to add metal oxide abrasives to the planarizing liquid 43. For example, the planarizing liquid 43 can include titania abrasive particles to planarize a substrate assembly 12 having titania diffusion barriers or the planarizing liquid 43 can include alumina abrasive particles to planarize a substrate assembly 12 having alumina structures. However, this approach has several drawbacks as well. For example, the polishing rate can be influenced by the distribution of the planarizing liquid 43 between the substrate assembly 12 and the planarizing surface 42 of the polishing pad 41. The distribution of the planarizing liquid 43 may not be uniform across the surface of the substrate assembly 12 because the leading edge of the substrate assembly 12 can wipe a significant portion of the planarizing liquid 43 from the polishing pad 41 before the planarizing liquid 43 can contact the other areas of the substrate assembly. The non-uniform distribution of planarizing liquid 43 under the substrate assembly 12 can cause certain areas of the substrate assembly 12 to have a higher polishing rate than other areas because they have more contact with the chemicals and/or abrasive particles in the planarizing liquid 43. The surface of the substrate assembly 12 may accordingly not be uniformly planar, and in extreme cases, some devices may be damaged or destroyed by CMP processing.

The polishing rate may also vary from one substrate assembly to another, or even across a particular substrate, because the composition of the planarizing liquid 43 may vary. The chemicals added to the planarizing liquid 43 may degrade over time causing one batch of planarizing liquid 43 to have a different polishing rate than another batch of planarizing liquid 43. Additionally, many components in the planarizing liquid 43 settle in a liquid solution, and thus the concentration of chemicals of a particular batch of planarizing liquid 43 may also vary. As a result of the changes in the composition of the planarizing liquid 43, the polishing rate of a particular substrate assembly 12 may change, making it difficult to uniformly planarize the substrate assembly 12 and to stop the planarization at a desired endpoint.

Another conventional CMP method, used for planarizing a substrate having two different overlying metals, is to change the planarizing medium as the first metal is removed and the second metal is exposed. For example, the substrate can be moved from one polishing pad having an abrasivity selected for removing the first metal to another polishing pad having a different abrasivity selected for removing the second metal, after the second metal is exposed. Alternatively, the chemical composition of the planarizing liquid can be changed as the second metal is exposed. In this way, the planarizing medium can be tailored to the particular metal being removed. This approach can have several drawbacks. For example, it can be time consuming to move the substrate from one polishing pad to another, or to change planarizing liquids, thereby reducing the efficiency of the CMP process. Furthermore, this approach may not satisfactorily remove the first and second metals when both metals are exposed simultaneously. Thus, conventional CMP processing may not provide sufficiently planar surfaces or an adequate yield of operable devices.

SUMMARY OF THE INVENTION

The present invention is directed toward methods and apparatuses for planarizing microelectronic substrates. In one aspect of the invention, the apparatus can include a fixed abrasive polishing pad having fixed abrasive elements that are selected to correspond to a metal in the microelectronic substrate. For example, where the microelectronic substrate includes a metal such as titanium, the polishing pad can include a compound of titanium, such as titanium dioxide. Alternatively, the polishing pad can include a refractory metal where the microelectronic substrate includes the same or a different refractory metal.

In another aspect of the invention, the apparatus can include the combination of a metal-containing microelectronic substrate and a fixed abrasive polishing pad. The substrate can have a metal feature with a first metal material and a second metal material adjacent to the first metal material. The fixed abrasive polishing pad can include a suspension medium having a plurality of abrasive elements that together have a first removal rate of the first metal material and a second removal rate of the second metal material such that a ratio of the first removal rate to the second removal rate is less than or equal to approximately two. The metal feature can include an interconnect located within a selected layer of the substrate, or it can include a conductive plug that extends between layers of the substrate.

In a method in accordance with still another aspect of the invention, a single planarizing liquid and a single polishing pad having fixed abrasive elements that include a metal compound can be engaged with a microelectronic substrate to remove metal material from the substrate. For example, where the substrate includes a substrate material with first and second metals, the second metal forming an interface with the substrate material and the first metal disposed on the second metal, the method can include engaging the substrate with the single polishing pad and the single planarizing liquid to remove both the first and second metals and expose the substrate material.

DETAILED DESCRIPTION OF THE INVENTION

The present disclosure describes methods and apparatuses for mechanical and/or chemical-mechanical planarization of substrate assemblies used in the fabrication of microelectronic devices. Many specific details of certain embodiments of the invention are set forth in the following description and in FIGS. 2–6 to provide a thorough understanding of the embodiments described herein. One skilled in the art, however, will understand that the present invention may have additional embodiments, or that the invention may be practiced without several of the details described in the following description.

Figure 2:
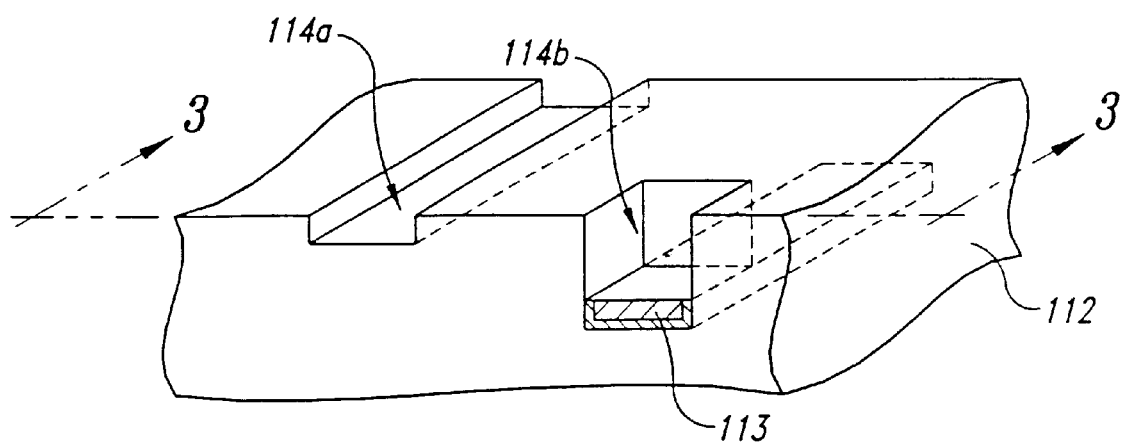
FIG. 2 is a partially cutaway isometric view of a portion of a microelectronic substrate suitable for planarization in accordance with an embodiment of the invention.

FIG. 2 is a partially cutaway isometric view of a portion of a microelectronic substrate 112, which is shown to provide details of the environment in which an embodiment of the invention operates. The microelectronic substrate 112 can include a substrate material such as a semiconductor or dielectric material having etched surface features 114, shown as a laterally extending trench 114a and a downwardly extending hole 114b. The laterally extending trench 114a can be filled with a conductive material to provide conductive links between features located at the same elevation of the substrate 112. The downwardly extending hole 114b can be filled with a conductive material to provide a conductive link between one feature (such as a conductive line or interconnect 113) located at one elevation of the substrate 112, and other features located at other elevations of the substrate 112.

Figure 3:
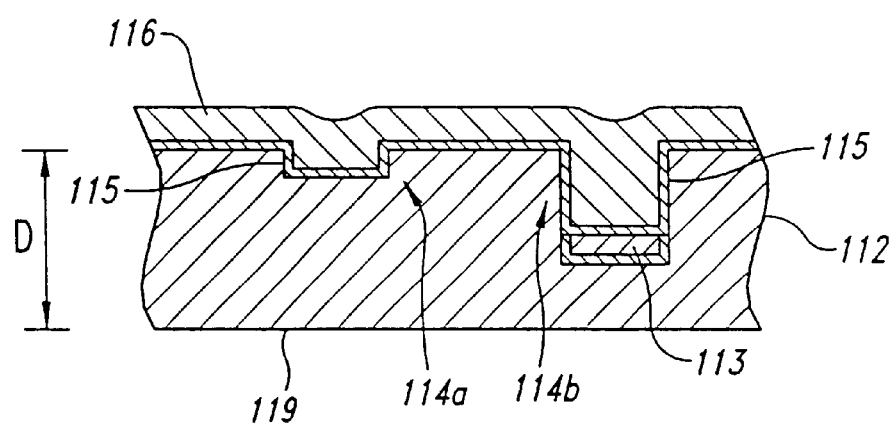
FIG. 3 is a cross-sectional view of the substrate shown in FIG. 2 with conductive materials disposed thereon, taken substantially along line 3—3 of FIG. 2.

FIG. 3 is a cross-sectional side elevation view of the substrate 112 shown in FIG. 2 after a diffusion barrier 115 has been disposed on the walls of the features 114 and a conductive material 116 has been disposed on the diffusion barrier 115. The diffusion barrier 115 forms an interface with the substrate material that is positioned a distance D from a rear surface 119 of the substrate 112. The diffusion barrier 115 can prevent or at least restrict diffusion of the conductive material 116 into the substrate 112. Accordingly, the diffusion barrier 115 can include materials such as titanium dioxide, titanium nitride, tantalum oxide, tantalum nitride, tungsten, tungsten compounds or other elements or compounds that prevent or restrict diffusion of the conductive material 116. The conductive material 116 provides the conductive links discussed above and can be formed from any conductive metal, such as copper, aluminum, tungsten or compounds thereof. In one embodiment, the conductive material 116 can include titanium nitride, which has a reduced tendency to diffuse into the substrate 112, and the diffusion barrier 115 can therefore be eliminated.

Figure 4:
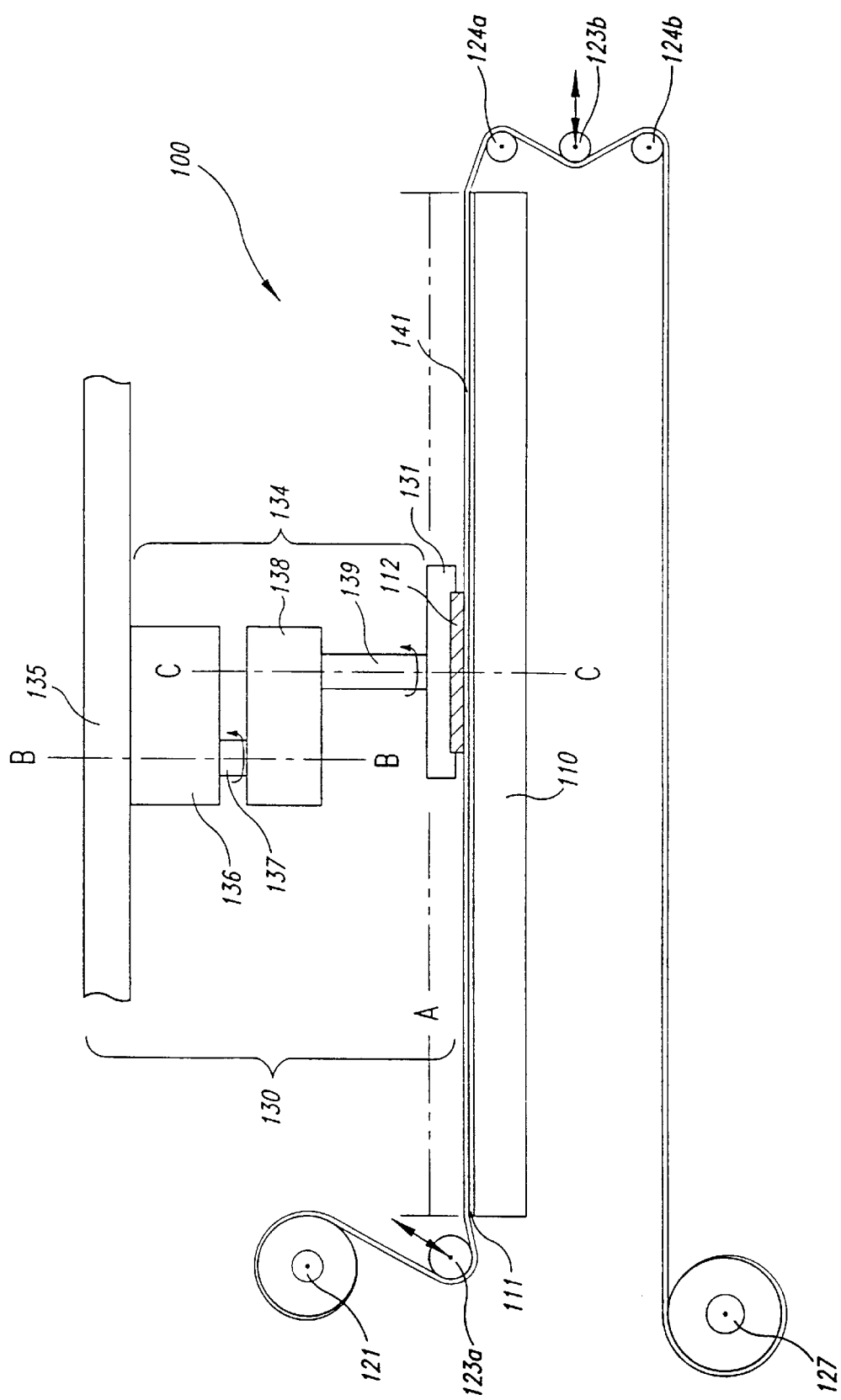
FIG. 4 is a partially schematic, partial cross-sectional side elevation view of a planarizing machine having a polishing pad in accordance with an embodiment of the invention.

FIG. 4 is a partially schematic, partial cross-sectional side elevation view of a planarizing machine 100 and a polishing pad 141 in accordance with one embodiment of the invention for planarizing the substrate 112. The features and advantages of the polishing pad 141 are best understood in the context of the structure and the operation of the planarizing machine 100. Thus, the general features of the planarizing machine 100 will be described initially.

The planarizing machine 100 is a web-format planarizing machine with a support table 110 having a top-panel 111 at a workstation where an operative portion "A" of the polishing pad 141 is positioned. The top-panel 111 is generally a rigid plate that provides a flat, solid surface to which a particular section of the polishing pad 141 may be secured during planarization. The planarizing machine 100 also has a plurality of rollers to guide, position and hold the polishing pad 141 over the top-panel 111. In one embodiment, the rollers include a supply roller 121, first and second idler rollers 123a and 123b, first and second guide rollers 124a and 124b, and a take-up roller 127. The supply roller 121 carries an unused or pre-operative portion of the polishing pad 141, and the take-up roller 127 carries a used or post-operative portion of the polishing pad 141. Additionally, the first idler roller 123a and the first guide roller 124a stretch the polishing pad 141 over the top-panel 111 to hold the polishing pad 141 stationary during operation. A motor (not shown) drives the take-up roller 127 and can also drive the supply roller 121 to sequentially advance the polishing pad 141 across the top-panel 111. As such, clean pre-operative sections of the polishing pad 141 may be quickly substituted for worn sections to provide a consistent surface for planarizing and/or cleaning the substrate 112.

The planarizing machine 100 also has a carrier assembly 130 to translate the substrate 112 across the polishing pad 141. In one embodiment, the carrier assembly 130 has a substrate holder 131 to pick up, hold and release the substrate 112 at appropriate stages of the planarizing and finishing cycles. The carrier assembly 130 may also have a support gantry 135 carrying a drive assembly 134 that translates along the gantry 135. The drive assembly 134 generally has an actuator 136, a drive shaft 137 coupled to the actuator 136, and an arm 138 projecting from the drive shaft 137. The arm 138 carries the substrate holder 131 via a terminal shaft 139. In another embodiment, the drive assembly 135 can also have another actuator (not shown) to rotate the terminal shaft 139 and the substrate holder 131 about an axis C—C as the actuator 136 orbits the substrate holder 131 about the axis B—B. One suitable planarizing machine without the polishing pad 141 is manufactured by Obsidian, Inc. of Fremont, Calif. In light of the embodiments of the planarizing machine 100 described above, a specific embodiment of the polishing pad 141 will now be described in more detail.

Figure 5:
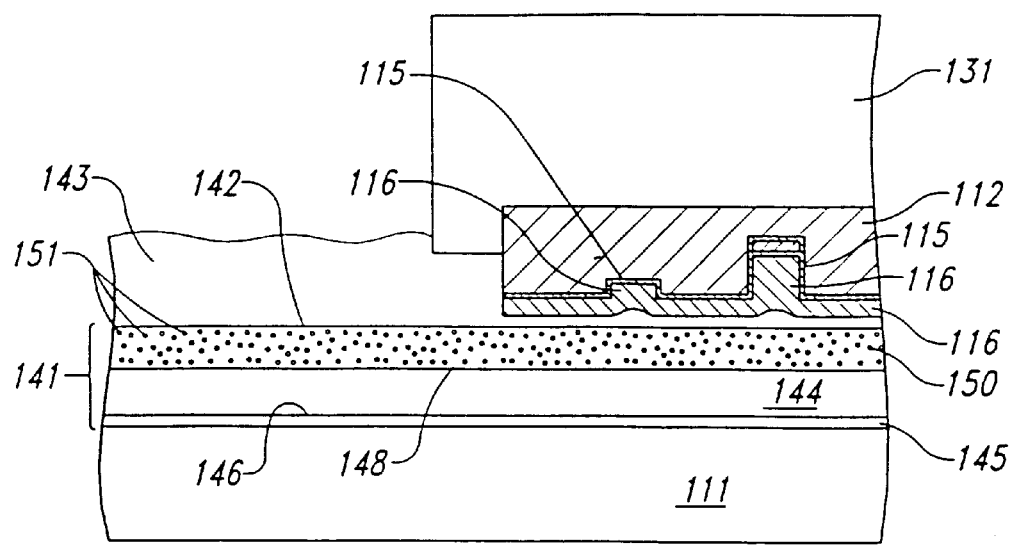
FIG. 5 is a detailed partially schematic cross-sectional side elevation view partially illustrating the polishing pad shown in FIG. 5, along with an inverted portion of the substrate shown in FIG. 3.

FIG. 5 is a detailed partially schematic cross-sectional side elevation view partially illustrating the polishing pad 141 according to one embodiment of the invention, positioned over the top-panel 111 of the planarizing machine 100 (FIG. 5). The substrate 112 is supported by the substrate holder 131 in an inverted position over the polishing pad 141. In the embodiment shown in FIG. 5, the polishing pad 141 has a backing film 145, a body 144 attached to the backing film 145, and a suspension medium 150 attached to the body 144. The backing film 145 is generally a flexible sheet that can wrap around the rollers of the planarizing machine 100. The backing film 145 also generally has a high tensile strength to withstand the tensile forces exerted on the polishing pad 141 as an operative section of the polishing pad 141 is stretched over the top-panel 111. One suitable material for the backing film 145 is Mylar® manufactured by E. I. Du Pont de Nemours of Wilmington, Del.

The body 144 of the polishing pad 141 has a backing surface 146 and a front surface 148 opposite the backing surface 146. The backing surface 146 is configured to be attached to the backing film 145, and the front surface 148 is preferably a highly planar surface facing away from the top-panel 111 to provide an interface surface for the suspension medium 150. The body 144 is generally composed of a continuous phase matrix material, such as polyurethane, or other suitable polishing pad materials. In general, the body 144 is designed to provide the polishing pad 141 with a selected level of compressibility/rigidity. Alternatively, the body 144 can be eliminated and the suspension medium 150 can be attached directly to the backing film 145.

The suspension medium 150 has a planarizing surface 142 facing opposite the backing film 145. In one embodiment, the planarizing surface can be generally flat and in other embodiments, the planarizing surface 142 can be textured to improve its performance. In any case, the suspension medium 150 can include a plurality of abrasive elements 151 distributed throughout the suspension medium 150 and adjacent the planarizing surface 142 for removing material from the substrate 112. Accordingly, the suspension medium 150 can include a binder material, such as an organic resin typically used for fixed abrasive polishing pads. Alternatively, the suspension medium 150 can include other materials that fixedly retain the abrasive elements 151.

The abrasive elements 151 can have a variety of shapes, sizes, compositions and distributions, so long as they effectively planarize the substrate 112. For example, the abrasive elements 151 can be spherical with a diameter of between approximately 10 nm and approximately 1000 nm. In one aspect of this embodiment, the abrasive elements 151 can have a diameter of between approximately 50 nm and approximately 500 nm. The abrasive elements 151 can be uniformly distributed throughout the suspension medium 150, or alternatively, the abrasive elements 151 can be concentrated in selected regions of the suspension medium 150 to locally increase the planarizing rate of the polishing pad 141.

In one embodiment, the abrasive elements 151 can be selected such that the polishing pad 141 planarizes the conductive material 116 at a rate that is less than five times the rate at which the polishing pad 141 planarizes the diffusion barrier 115. Accordingly, an embodiment of the invention can reduce the tendency for the polishing pad 141 to over-planarize the conductive material 116 relative to the diffusion barrier 115, when both materials simultaneously contact the polishing pad 141. For example, in one aspect of this embodiment, the polishing pad 141 can include titanium dioxide (titania) abrasive elements 151 and can planarize a copper conductive material 116 at approximately twice the rate with which the polishing pad 141 planarizes a titanium diffusion barrier 115.

In a further aspect of this embodiment, the ratio of the conductive material planarizing rate to the diffusion barrier planarizing rate can be approximately 1:1 by providing a planarizing liquid 143 on the planarizing surface 142 of the polishing pad 141. The planarizing liquid 143 can include fluids known to those skilled in the art that chemically enhance the planarizing rate, for example, oxidizing solutions such as ammonium persulfate, hydrogen peroxide and/or ferric nitrate. Alternatively, the planarizing liquid 143 can include a chemical etchant, such as phosphoric acid or oxalic acid. In either case, the planarizing liquid can also include a corrosion inhibitor, such as benzotriazole, to halt oxidation or etching once a selected portion of material has been removed. Accordingly, the planarizing liquid 143 is generally similar to commercially available chemical slurries, but does not include suspended abrasive particles. In other embodiments, the planarizing liquid 143 can include other compounds that control the planarizing rate.

In still another embodiment, the composition of the abrasive elements 151 can be selected to be a compound of either the conductive material 116 or the material forming the diffusion barrier 115. For example, where the diffusion barrier 115 includes titanium, the abrasive elements 151 can be selected to be a compound of titanium, such as titanium dioxide. Alternatively, the abrasive elements 151 can be selected to include other compounds of the conductive material 116 or the diffusion barrier 115.

Figure 6:
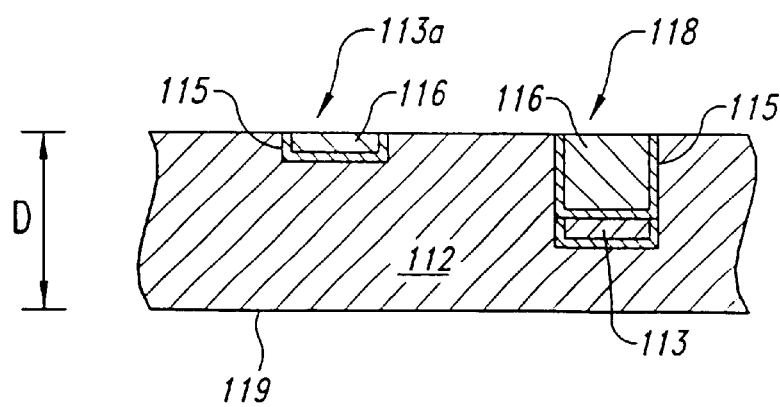
FIG. 6 is a cross-sectional view of the substrate shown in FIG. 5 after planarization in accordance with an embodiment of the invention.

FIG. 6 is a cross-sectional view of the substrate 112 shown in FIG. 5, after planarization. The conductive material 116 and diffusion barriers 115 have been planarized down to the distance D from the rear surface 119 of the substrate 112, exposing a portion of the substrate material and forming a conductive interconnect 113a and a conductive plug 118, each of which has a generally flat upper surface. Accordingly, the substrate 112 can support the formation of sub-micron features formed on top of the upper surfaces.

One feature of polishing pads 141 having abrasive elements 151 in accordance with the embodiments discussed above is that the ratio of the planarizing rate of the conductive material 116 to the planarizing rate of the diffusion barrier 115 can be in the range of between about 5:1 and about 1:1, and in one aspect of the embodiments, less than or equal to approximately 2:1. Accordingly, the polishing pad 141 will be less likely to overplanarize the conductive material 116 relative to diffusion barrier 115, which can result in "dishing" the conductive material 116, and which can form a nonplanar surface.

Another feature of the polishing pads 141 discussed above is that the abrasive elements 151 can be fixedly attached to the suspension medium 150 to form a fixed abrasive polishing pad. This feature is advantageous because it can be easier to control the planarizing rate of the polishing pad 141 where the abrasive elements 151 are fixedly attached to the suspension medium 150, as compared to planarizing media in which the abrasive elements are dispersed in a slurry. Furthermore, the fixed abrasive elements may be less likely to dish the substrate 112 than are abrasive elements dispersed in a slurry.

Still another feature of the polishing pads 141 and the planarizing liquids 143 is that a single polishing pad 141 and a single planarizing liquid 143 can effectively remove both the conductive material 116 and enough of the diffusion barrier 115 to expose the underlying substrate material. An advantage of this feature is that conductive features, such as the interconnect 113a and the conductive plug 118 can be formed without engaging the substrate 112 with two separate polishing pads 141, and/or without exposing the substrate 112 to two separate planarizing liquids 143, reducing the duration and complexity of the planarizing process. Alternatively, the single polishing pad 141 can be used in combination with two planarizing liquids, one that preferentially removes the conductive material 116 and another that preferentially removes the diffusion barrier 115 once the diffusion barrier 115 is exposed. This alternate method can also provide advantages over some conventional methods because only a single polishing pad 141 is necessary to effectively planarize the substrate 112.

Figure 1:
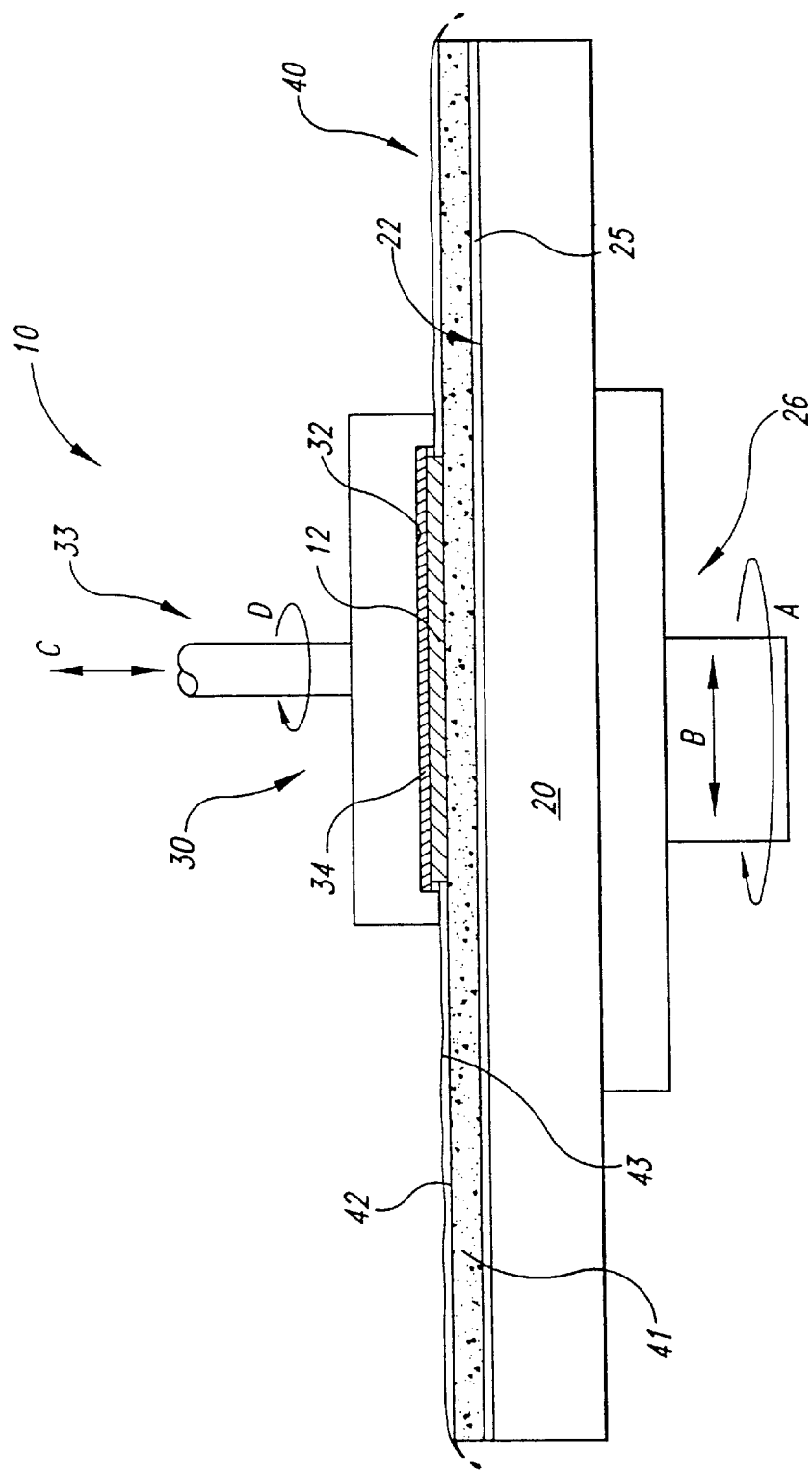
FIG. 1 is a partially schematic, partial cross-sectional side elevation view of a planarizing machine in accordance with the prior art.

From the foregoing it will be appreciated that, although specific embodiments of the invention have been described herein for purposes of illustration, various modifications may be made without deviating from the spirit and scope of the invention. For example, although the embodiments of the polishing pad 141 illustrated in FIG. 6 includes a backing film 145, other embodiments of polishing pads in accordance with the invention do not include a backing film. The embodiments of the polishing pads shown in FIG. 6 include the backing film 145 because they are well suited for use with the web-format planarizing machine 100 shown in FIG. 2. Other embodiments of the polishing pads having a generally circular planform shape without the backing film 145 are generally suitable for use with rotating platen planarizing machines similar to the planarizing machine 10 shown in FIG. 1. Additionally, depending upon the particular CMP application, a planarizing fluid with or without abrasive particles may be used on a polishing pad with or without abrasive particles. Accordingly, the invention is not limited except as by the appended claims.

What is claimed is:

1. A fixed abrasive polishing pad for planarizing a microelectronic substrate, comprising:
   a flexible backing film; and
   a suspension medium having a planarizing surface for engaging and planarizing the substrate, and an opposing surface facing the backing film, the medium having a plurality of generally spherical abrasive elements distributed therein, the abrasive elements having a diameter of between approximately 10 nm and less than approximately 500 nm.

2. The polishing pad of claim 1 wherein the backing film is comprised of MYLAR.

3. The polishing pad of claim 1 further comprising a body that is interposed between the backing film and the suspension medium.

4. The polishing pad of claim 3 wherein the body is comprised of a polymeric material.

5. The polishing pad of claim 4 wherein the polymeric material is further comprised of polyurethane.

6. The polishing pad of claim 1 wherein the abrasive elements include titanium dioxide.

7. The polishing pad of claim 1 wherein the abrasive elements include a titanium compound.

8. The polishing pad of claim 7 wherein the abrasive elements are selected from a titanium compound.

9. The polishing pad of claim 8 wherein the abrasive elements include titanium dioxide.

10. The polishing pad of claim 1 wherein the abrasive elements are selected from a tantalum compound.

11. The polishing pad of claim 10 wherein the abrasive elements include tantalum oxide.

12. The polishing pad of claim 10 wherein the abrasive elements include tantalum nitride.

13. The polishing pad of claim 1 wherein the abrasive elements have a diameter of between approximately 50 nm and less than approximately 500 nm.

14. The polishing pad of claim 1 wherein the suspension medium includes an elongated flexible web configured to be wound from a first roller across a platen to a second roller.

15. A fixed abrasive polishing pad for planarizing a microelectronic substrate, comprising:

a flexible backing film; and a suspension medium including an organic resin material and having a planarizing surface for engaging and planarizing the substrate, and an opposing surface facing the backing film, the medium having a plurality of generally spherical abrasive elements distributed therein, the abrasive elements having a diameter of between approximately 10 nm and less than approximately 500 nm.

16. The polishing pad of claim 15 wherein the backing film is comprised of MYLAR.

17. The polishing pad of claim 15 further comprising a body that is interposed between the backing film and the suspension medium.

18. The polishing pad of claim 17 wherein the body is comprised of a polymeric material.

19. The polishing pad of claim 18 wherein the polymeric material is further comprised of polyurethane.

20. The polishing pad of claim 15 wherein the abrasive elements include titanium dioxide.

21. The polishing pad of claim 15 wherein the abrasive elements include a titanium compound.

22. The polishing pad of claim 15 wherein the abrasive elements are selected from a titanium compound.

23. The polishing pad of claim 22 wherein the abrasive elements include titanium dioxide.

24. The polishing pad of claim 15 wherein the abrasive elements are selected from a tantalum compound.

25. The polishing pad of claim 24 wherein the abrasive elements include tantalum oxide.

26. The polishing pad of claim 24 wherein the abrasive elements include tantalum nitride.

27. The polishing pad of claim 15 wherein the abrasive elements have a diameter of between approximately 10 nm and less than approximately 500 nm.

28. The polishing pad of claim 15 wherein the abrasive elements have a diameter of between approximately 50 nm and approximately 500 nm.

29. The polishing pad of claim 15 wherein the suspension medium has a generally circular planform shape for mounting to a generally circular platen.

30. The polishing pad of claim 15 wherein the suspension medium includes an elongated flexible web configured to be wound from a first roller across a platen to a second roller.

31. A fixed abrasive polishing pad for planarizing a microelectronic substrate, comprising:

a flexible backing film; and a suspension medium having a generally circular planform shape for mounting to a generally circular platen, and having a planarizing surface for engaging and planarizing the substrate, and an opposing surface facing the backing film, the medium having a plurality of generally spherical abrasive elements distributed therein, the abrasive elements having a diameter of between approximately 10 nm and less than approximately 500 nm.

32. The polishing pad of claim 31 wherein the backing film is comprised of MYLAR.

33. The polishing pad of claim 31 further comprising a body that is interposed between the backing film and the suspension medium.

34. The polishing pad of claim 33 wherein the body is comprised of a polymeric material.

35. The polishing pad of claim 34 wherein the polymeric material is further comprised of polyurethane.

36. The polishing pad of claim 31 wherein the abrasive elements include titanium dioxide.

37. The polishing pad of claim 31 wherein the abrasive elements include a titanium compound.

38. The polishing pad of claim 37 wherein the abrasive elements are selected from a titanium compound.

39. The polishing pad of claim 38 wherein the abrasive elements include titanium dioxide.

40. The polishing pad of claim 31 wherein the abrasive elements are selected from a tantalum compound.

41. The polishing pad of claim 40 wherein the abrasive elements include tantalum oxide.

42. The polishing pad of claim 40 wherein the abrasive elements include tantalum nitride.

43. The polishing pad of claim 31 wherein the abrasive elements have a diameter of between approximately 50 nm and less than approximately 500 nm.

44. The polishing pad of claim 31 wherein the suspension medium includes an organic resin material.

* * * * *